United States Patent [19]
Ozcelik et al.

[11] Patent Number: 5,903,311
[45] Date of Patent: May 11, 1999

[54] RUN LEVEL PAIR BUFFERING FOR FAST VARIABLE LENGTH DECODER CIRCUIT

[75] Inventors: Taner Ozcelik, Fremont; Shirish C. Gadre, San Jose; Moshe Bublil, Sunnyvale; Sabyasachi Dutta, San Jose; Subroto Bose, Santa Clara, all of Calif.

[73] Assignees: Sony Corporation, Tokyo, Japan; Sony Electronics Inc, Park Ridge, N.J.

[21] Appl. No.: 08/866,701

[22] Filed: May 30, 1997

[51] Int. Cl.⁶ .................................................. A04N 7/30
[52] U.S. Cl. ................................................................ 348/403
[58] Field of Search .................................... 348/403, 400, 348/401, 402; H04N 7/36, 7/50, 7/30

[56] References Cited

U.S. PATENT DOCUMENTS

| | | | |
|---|---|---|---|
| 5,142,380 | 8/1992 | Sakagami et al. | 358/432 |
| 5,363,097 | 11/1994 | Jan | 341/67 |
| 5,386,234 | 1/1995 | Veltman | 348/409 |
| 5,461,420 | 10/1995 | Yonemitsu et al. | 348/401 |
| 5,481,553 | 1/1996 | Suzuki | 348/403 |
| 5,515,388 | 5/1996 | Yagasaki | 371/49.1 |
| 5,668,599 | 9/1997 | Cheney | 348/402 |

FOREIGN PATENT DOCUMENTS

| | | | |
|---|---|---|---|
| 0618722 A1 | 10/1994 | European Pat. Off. | H04N 5/907 |
| 0710026 A2 | 5/1996 | European Pat. Off. | H04N 7/24 |
| 0710028 A2 | 5/1996 | European Pat. Off. | H04N 7/24 |
| 0714208 A2 | 5/1996 | European Pat. Off. | H04N 7/24 |
| 2752654 A1 | 2/1998 | France | H04N 5/907 |
| WO 96/14710 | 5/1996 | WIPO | H04N 7/00 |

*Primary Examiner*—Howard Britton
*Attorney, Agent, or Firm*—Limbach & Limbach L.L.P.

[57] ABSTRACT

A decoding circuit for decoding (or decompressing) compressed video data includes an RL circuit, such as MPEG encoded video data. The RL circuit includes a buffer memory for storing run-level pairs during the decoding process. Because the buffer memory in the RL circuit can store ran-level pairs, Huffman-decoding and header decoding, performed by a variable length decoding (VLD) circuit, is decoupled from inverse discrete transform decoding, performed by an IDCT circuit. This decoupling speeds up the decoding pipeline by allowing more continuous operation by both the VLD and IDCT circuits.

9 Claims, 8 Drawing Sheets

RUN LEVEL PAIR BUFFERING FOR FAST VARIABLE LENGTH DECODER CIRCUIT

BACKGROUND OF THE INVENTION

The present invention relates to a method and apparatus for video data decoding. More specifically, the present invention relates to a chip for decoding video data which has been compressed according to standard video data compression schemes, such as MPEG1 and MPEG2.

DESCRIPTION OF THE RELATED ART

Advances in audio and video compression and decompression techniques, together with very large scale integration technology, have enabled the creation of new capabilities and markets. These include the storage of digital audio and video in computers and on small optical discs as well as the transmission of digital audio and video signals from direct broadcast satellites.

Such advances were made possible, in part, by international standards which provide compatibility between different approaches to compression and decompression. One such standard is known as "JPEG," for Joint Photographic Expert Group. A later developed standard is known as "MPEG 1." This was the first set of standards agreed to by the Moving Pictures Expert Group. Yet another standard is known as "ITU-T H.261", which is a video compression standard particularly useful for video teleconferencing. Although each standard is designed for a specific application, all of the standards have much in common.

MPEG1 was designed for storing and distributing audio and motion video, with emphasis on video quality. Its features include random access, fast forward and reverse playback. MPEG1 serves as the basis for video compact disks and for many video games. The original channel bandwidth and image resolution for MPEG1 were established based upon the recording media then available. One goal of MPEG1 was the reproduction of recorded digital audio and video using a standard CD-ROM ("video CD") with a bit rate of 1.416 Mbps, 1.15 Mbps of which are allocated to video.

The compressed bit streams generated under the MPEG1 standard implicitly define the decompression algorithms to be used for such bit streams. The compression algorithms, however, can vary within the specifications of the MPEG 1 standard, thereby allowing the possibility of a proprietary advantage in regard to the generation of compressed bit streams.

A later developed standard known as "MPEG2" extends the basic concepts of MPEG1 to cover a wider range of applications. Although the primary application of the MPEG2 standards is the all digital transmission of broadcast-quality video at bit rates of 4 Mbps to 9 Mbps, it appears that the MPEG2 standard may also be useful for other applications, such as the storage of full length motion pictures on DVD discs with resolution at least as good as that presently provided by 12 inch diameter laser discs.

The MPEG2 standard relies upon three types of coded pictures. I ("intra") pictures are fields or frames coded as a stand-alone still image. Such I pictures allow random access points within a video stream. As such, I pictures should occur about two times per second. I pictures should also be used where scene cuts (such as in a motion picture) occur.

P ("predicted") pictures are fields or frames coded relative to the nearest previous I or P picture, resulting in forward prediction processing. P pictures allow more compression than I pictures through the use of motion compensation, and also serve as a reference for B pictures and future P pictures.

B ("bidirectional") pictures are fields or frames that use the most proximate (with respect to display order) past and future I or P picture as a reference, resulting in bidirectional prediction. B pictures provide the most compression and increase signal to noise ratio by averaging two pictures.

Such I, P and B pictures are more thoroughly described in U.S. Pat. Nos. 5,386,234 and 5,481,553 assigned to Sony Corporation and said U.S. Patents are incorporated herein by reference.

A group of pictures ("GOP") is a series of one or more coded pictures which assist in random accessing and editing. A GOP value is configurable during the encoding process. Since the I pictures are closer together, the smaller the GOP value, the better the response to movement. The level of compression is, however, lower.

In a coded bitstream, a GOP must start with an I picture and may be followed by any number of I, P or B pictures in any order. In display order, a GOP must start with an I or B picture and end with an I or P picture. Thus, the smallest GOP size is a single I picture, with the largest size being 1024 pictures.

In further detail, FIG. 1 illustrates a simplified block diagram of an MPEG2 encoder 100. A video stream consisting of macroblock information and motion compensation information is provided to both a discrete cosine transformer 102 and a motion vector generator 104. Each 8×8 block (of pixels or error terms) is processed by the discrete cosine transformer 102 to generate an 8×8 block of horizontal and vertical frequency coefficients.

The quantizer 106 quantizes the 8×8 block of frequency-domain error coefficients, thereby limiting the number of allowed values.

Higher frequencies are usually quantized more coarsely than low frequencies, taking advantage of the human perception of quantization error. This results in many frequency-domain error coefficients being zero, especially at higher frequencies.

The output of quantizer 106 is processed by a zigzag scanner 108, which, starting with DC components, generates a linear stream of quantized frequency coefficients arranged in order of increasing frequency. This produces long runs of consecutive zero coefficients, which are sent to the variable length encoder 110.

The linear stream of quantized frequency-domain error coefficients is first run-length encoded by the variable length encoder 110. In the run-length encoding process, the linear stream of quantized frequency-domain error coefficients is converted into a series of run-amplitude (or run-level) pairs. Each pair indicates the number of zero coefficients and the amplitude of the non-zero coefficient which ends the run.

For example, assume a string of error coefficients as follows:
(1) Original error coefficients: 000060000038
Therefore, when this string of error coefficients is variable length encoded, according to the encoding rules described above, the following encoded run-level pairs are obtained:
(2) Encoded run-level pairs: (4,6) (5,3) (0,8)
Of course, as the number of zero coefficients is increased, the error coefficient data will be more effectively compressed by this variable length encoding.

After the variable length encoder 110 encodes the run-level pairs, it then Huffman encodes the run-level pairs. In the Huffman encoding, the run-level pairs are coded differently depending upon whether the run-level pair is included in a list of commonly-occurring run-level pairs. If the run-level pair being Huffman encoded is on the list of commonly-occurring pairs, then it will be encoded into a predetermined variable length code word which corresponds to the run-level pair. If, on the other hand, the run-level pair is not on the list, then the run-level pair is encoded as a predetermined symbol (such as an escape symbol) followed by a fixed length codes to avoid long code words and to reduce the cost of implementation.

The run-length encoded and Huffman encoded output of the variable length encoder 110 provides a coded video bitstream. Picture type determination circuit 112 determines whether the frame being encoded is a P picture, an I picture or a B picture. In the case of a P or I picture, picture type determination circuit 110 causes the motion vector generator 104 to generate an appropriate motion vector which is then provided to variable length encoder 110. Such motion vector is then coded and combined with the output of variable length encoder 110.

As explained above, compressed video data may come from a local storage device, such as an optical disc, or it may come from a transmission, such as a digital broadcast transmission. However, before the video data can be displayed on a display device, such as a cathode ray tube display device, the video data must be decompressed.

Therefore, a device for reproducing and/or displaying compressed video data includes a circuit for decompressing the video data. A conventional circuit for decoding video data is now explained with reference to the block diagram shown in FIG. 2. The decoding circuit of FIG. 2 includes an input buffer 202, variable length decoding (VLD) circuit 204, inverse discrete cosine transform (IDCT) circuit 210, motion compensation circuit 212, frame buffer memory 214 and display 216.

Compressed video data I is input to the input buffer 202. The video data I may come from a RAM memory (not shown), or directly from a local reproduction device, such as an optical disc, or directly from an antenna for receiving a broadcast. The video data I is compressed, as described above, according to a conventional format, such as MPEG1 or MPEG2. The input buffer 202 may be a relatively small memory which only has capacity to store compressed data I for a small portion of a frame.

The compressed video data I is then sent to VLD circuit 204, where the coded symbols are decoded and broken down into header information, motion vectors, and error coefficient information. The decoded header information is used for control purposes and is sent out from the VLD circuit 204 to various other components of the system, such as the system CPU (not shown). The decoded motion vectors MV are sent to the motion compensation circuit 212.

The error coefficient information is in the form of frequency-domain matrix algebraic coefficients which have been Huffman-encoded and run-length encoded. The VLD circuit 204 Huffman-decodes and run-length decodes the error coefficient information to send frequency-domain error coefficients FEC to the IDCT circuit 210.

The VLD circuit 204 first Huffman decodes the frequency-domain error coefficients so that the (commonly-occurring) variable length codes and the (not commonly-occurring fixed length codes are decoded to yield run-level pairs representing the frequency-domain error coefficients.

The VLD circuit 204 will then run-length decode all of the run-level pairs into strings of frequency-domain error coefficients FEC, so that further decoding can take place in IDCT circuit 210. For example, if the VLD circuit 204 Huffman-decodes compressed error coefficient information to yield the following run-level pairs:

(3) compressed data I: (4,6) (5,3) (0,8)
then the VLD circuit will do run-length decoding to obtain expanded frequency-domain error coefficients FEC:
(4) FEC: 000060000038.

The IDCT circuit 210 then performs an inverse discrete transform to convert the frequency-domain matrix algebraic expanded error coefficients FEC into the spatial domain to yield spatial domain error coefficients SEC. The IDCT circuit 210 then outputs the spatial-domain error coefficients SEC to the motion compensation circuit 212. Although most of the examples discussed herein will assume that the compressed error coefficients have been transformed by a discrete cosine transform into the frequency-domain during compression, it is noted that other kinds of transforms (and consequent inverse transforms) are possible. The term transform-domain is used herein to generally denote data which has been compressed by a transform. The term display-domain is used herein to generally denote data which has been decompressed by an inverse transform.

In order to obtain displayable pixel data PD for bi-directional B-frames, the motion compensation circuit 212 utilizes the spatial-domain error coefficients SEC and the motion vectors MV in conjunction with pixel data PD of other intra I frames and predicted P frames. More specifically, the spatial-domain error coefficients SEC are supplied by the IDCT circuit 210, and the decoded motion vectors MV are supplied by the VLD circuit 204. The data for the pixel data PD for the two I and/or P frames (used to calculate pixel data PD for an intermediate B frame) is stored in frame buffer memory 214.

As explained above, to obtain pixel data PD for a B frame, pixel data PD from one immediately previous (I or P) frame is used to calculate pixel data for a B-frame. This previous-frame pixel data PD is stored in the previous frame buffer portion 214A. The capacity of the previous frame buffer portion is 1X, where X is the amount of capacity required to store one frame (both top and bottom fields) of pixel data. For example, if the decoding circuit is designed for NTSC size frames, one frame will require (just for the luminance component of the image):
(5) X=345600 bits=(720·480) (pixel/frame)·8(bit/pixel).
This is, of course, a considerable amount of memory.

Likewise, as explained above, to obtain pixel data for a B frame, pixel data from one immediately subsequent (I or P) frame is used to calculate pixel data for a B-frame. This next-frame pixel data is stored in the next frame buffer portion 214B. The capacity of the previous frame buffer portion is another 1X, where X is the amount of capacity required to store one frame (both odd and even fields) of pixel data. Therefore, 2X of memory is required for storing the previous and next frames for B frame calculation.

However, in addition to storing pixel data for the previous and next frames, pixel data of the current B frame, which undergoing decoding, is also stored in a current frame buffer portion 214C. The capacity of the current frame buffer is another 1X, bringing the size of the frame buffer memory up to a sizeable 3X (e.g., 1036800 bits for an NTSC size frame).

The reason for storing the current B frame in the current frame buffer portion 214C will now be explained. The B frame being calculated includes a top field and a bottom field. In compression, such as MPEG1 or MPEG2 compression, the motion vectors and frequency-domain error coefficients associated with the top and bottom fields may be placed in reverse order and may even be intermingled.

However, because the bottom field is not displayed until after the top field has been decoded and displayed, the current B frame is stored in the current frame buffer 214C as it is decoded and calculated. This way, the bottom field pixel data can be temporarily held in the current frame buffer portion 214C until the display device 216 has displayed the top field of the current B frame and is ready for the bottom field pixel data.

B frame pixel data is sent from the current frame buffer 214C to the display 216 for display. The display 216 may be, for instance, a cathode ray tube monitor.

As discussed above, this conventional decoding circuit requires 3X of memory. This large memory requirement for B frame decoding drives up the cost of products employing the decoding circuit. A large frame memory is sometimes undesirable, especially when an easily portable video apparatus is desired.

SUMMARY OF THE INVENTION

It is an object of the present invention to provide a video decoding circuit for decoding (or decompressing) compressed video data, which is compressed according to standards such as MPEG1 and MPEG2. It is a further object of the present invention to provide a faster video decoding circuit for decoding compressed video data to produce displayable pixel data.

It is a feature of the present invention that there is a buffer memory for storing run-level pairs (preferably in run-level pair form) after they have been Huffman decoded, but before an inverse transform circuit (e.g., an inverse discrete cosine transform circuit) performs an inverse transform on the transform-domain error coefficients represented by the run-level pairs.

It is an advantage of the present invention that the video decoding pipeline is made faster because the variable length decoding performed by a VLD circuit is decoupled from the inverse transform processing of an IDCT circuit, thereby allowing both the VLD circuit and the IDCT circuit to operate in a more continuous manner. Also, when the decoding pipeline is made faster, it becomes possible to make reductions in the required size of a frame memory for storing uncompressed pixel data.

According to the present invention, a video decoding circuit decodes compressed video data and outputs displayable pixel data. The video decoding circuit includes a variable length decoding circuit, a run-level decoding circuit and an inverse transform circuit.

The variable length decoding circuit (VLD) receives the compressed video data from a storage device, such as a DRAM or a magneto-optical disc. The VLD circuit outputs run-level pairs corresponding to error coefficients. Additionally, the VLD circuit may also decode and output other information such as decoded header information and decoded motion vectors.

The run-level decoding circuit includes a buffer memory and a run-level decoding portion. The buffer memory receives and stores the run-level pairs output by the variable length decoding circuit. The ran-level decoding portion converts the run-level pairs stored in the buffer memory to transform-domain error coefficients. In a preferred embodiment, the run-level decoding portion includes a counter, a selector and a register. The counter receives the run number of a run-level pair and generates consecutive zeroes corresponding to the run number. The register receives the level number of the run-level pair and temporarily stores it. The selector selectively outputs the zeroes from the counter and the level number from the register so that the output of the selector will be a bit-string corresponding to the run-level pair. In this way, the run-level pair is run-level (or run-length) decoded.

Tn inverse transform circuit for receiving transform-domain error coefficients from the run-level decoding circuit and performs an inverse transform to produce display-domain error coefficients.

These and other objects, features and advantages will become apparent when considered with reference to the following description and the accompanying drawings.

DETAILED DESCRIPTION OF THE PREFERRED EMBODIMENTS

The present invention will first be explained with reference to a video decoding chip, explained with reference to FIGS. 3–5, which can decode MPEG1 or MPEG2 compressed video data which includes bi-directional (B) frames which respectively include interlaced top and bottom fields.

Figure 1:
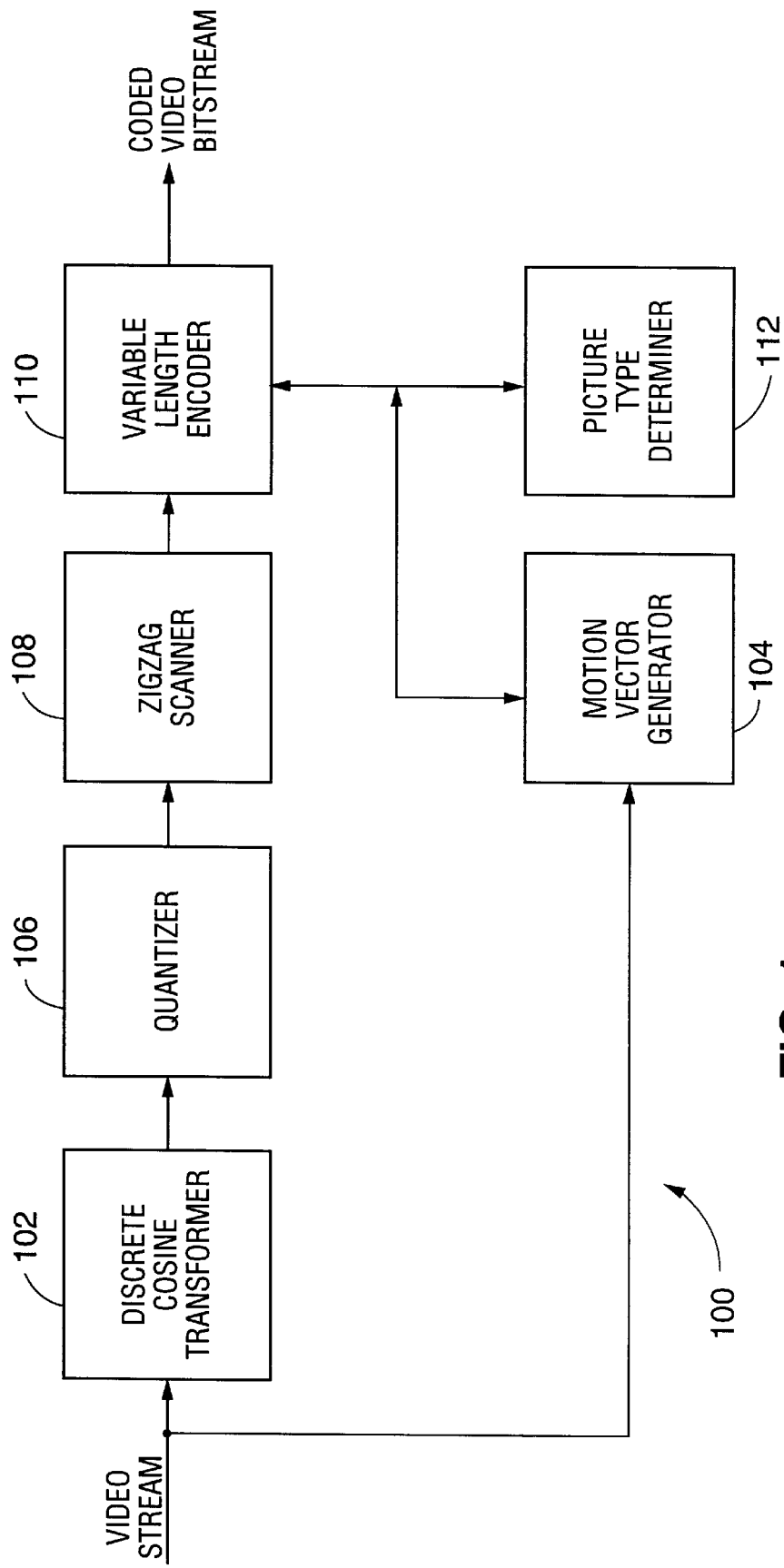
FIG. 1 is a simplified block diagram of a prior art MPEG2 video encoder.
Figure 2:
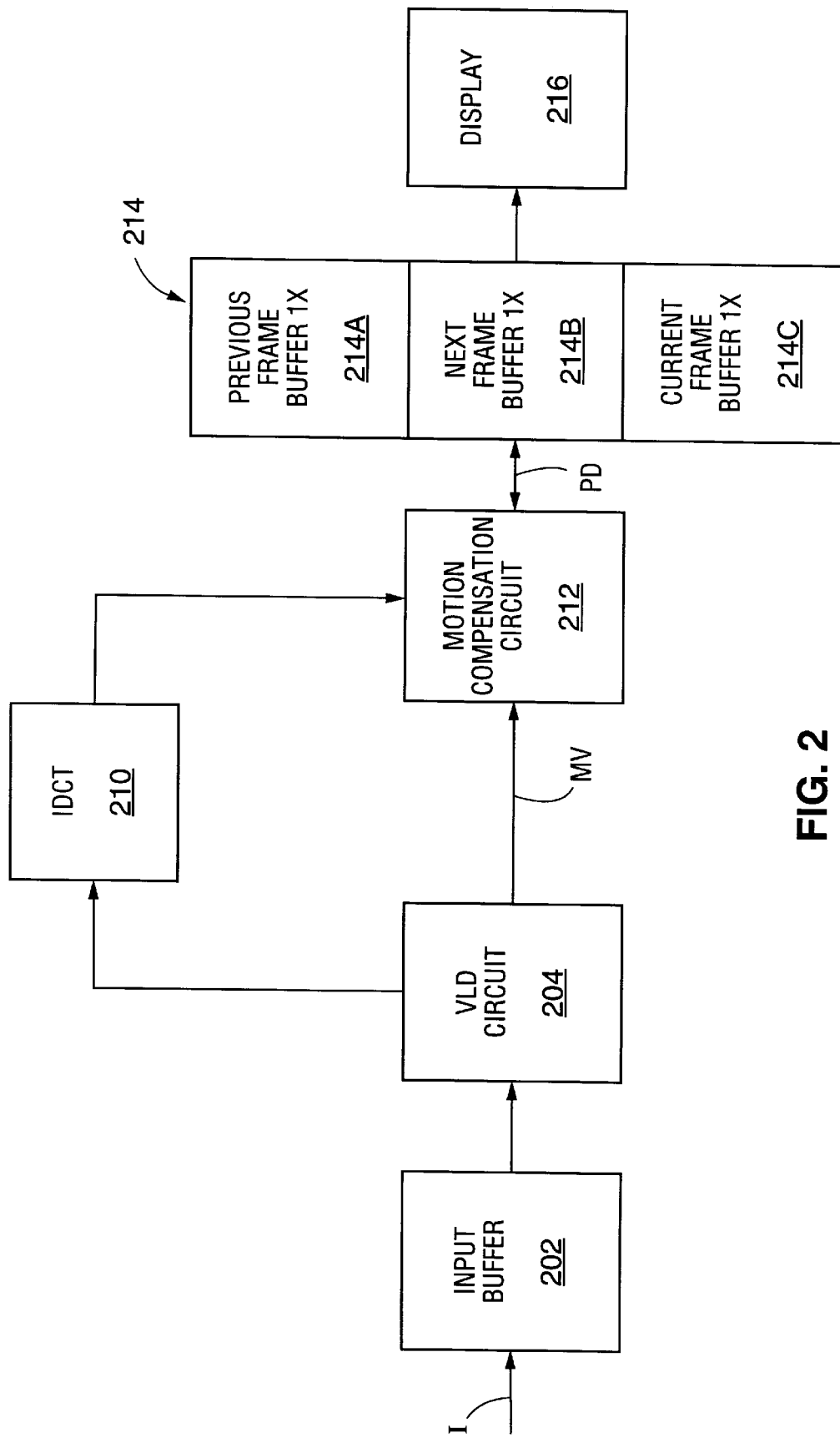
FIG. 2 is a simplified block diagram of a conventional MPEG2 video decoder circuit.
Figure 3:
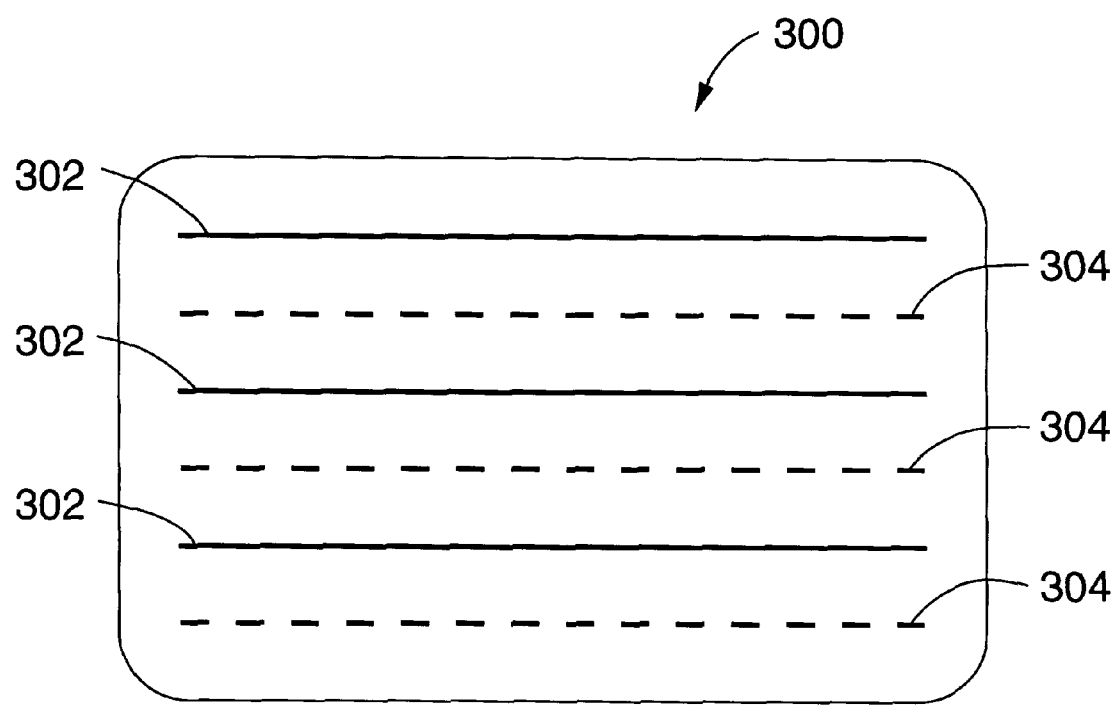
FIG. 3 is a diagram showing a video frame of two interlaced fields.

A schematic diagram of a frame 300 of an interlaced display is shown in FIG. 3. The frame 300 includes 6 horizontal rows of displayed pixels, wherein each pixel of the display corresponds to uncompressed pixel data. This frame 300 includes 3 horizontal rows of the top field 302, and 3 horizontal rows of the bottom field 304. It is noted that top and bottom interlaced fields are sometimes referred to as odd and even fields. Of course this example has been simplified, as displays often have far more than 6 rows. For instance, NTSC standard displays have 525 rows, and high resolution interlaced displays with over 1000 rows are becoming more common.

The top field rows 302 are displayed followed by the bottom rows 304. By spatially interlacing the top and bottom fields and displaying them in temporal sequence, a relatively smooth picture can be obtained at a relatively low display rate.

However, in many video data encoding methods, such as MPEG1 or MPEG2, video data corresponding to the top and bottom fields may be transmitted in reverse or intermingled order. Conventionally, this reverse order or intermingling was handled by decoding the video data once, displaying the data of the top field immediately, and storing the decoded, uncompressed data of the bottom field for display after the top field.

Due to the fact that the top and bottom fields are reversed or intermingled in the compressed video data, frame memory generally has sufficient capacity to store an entire uncompressed, predicted B frame. The frame memory will additionally include capacity to store a previous (I or P) frame and an entire next (I or P) frame to be used for motion prediction purposes in constructing a B frame. As explained above, this results in a frame memory of 3X in capacity for storing previous (I or P), next (I or P) and current (B) frames.

Figure 4:
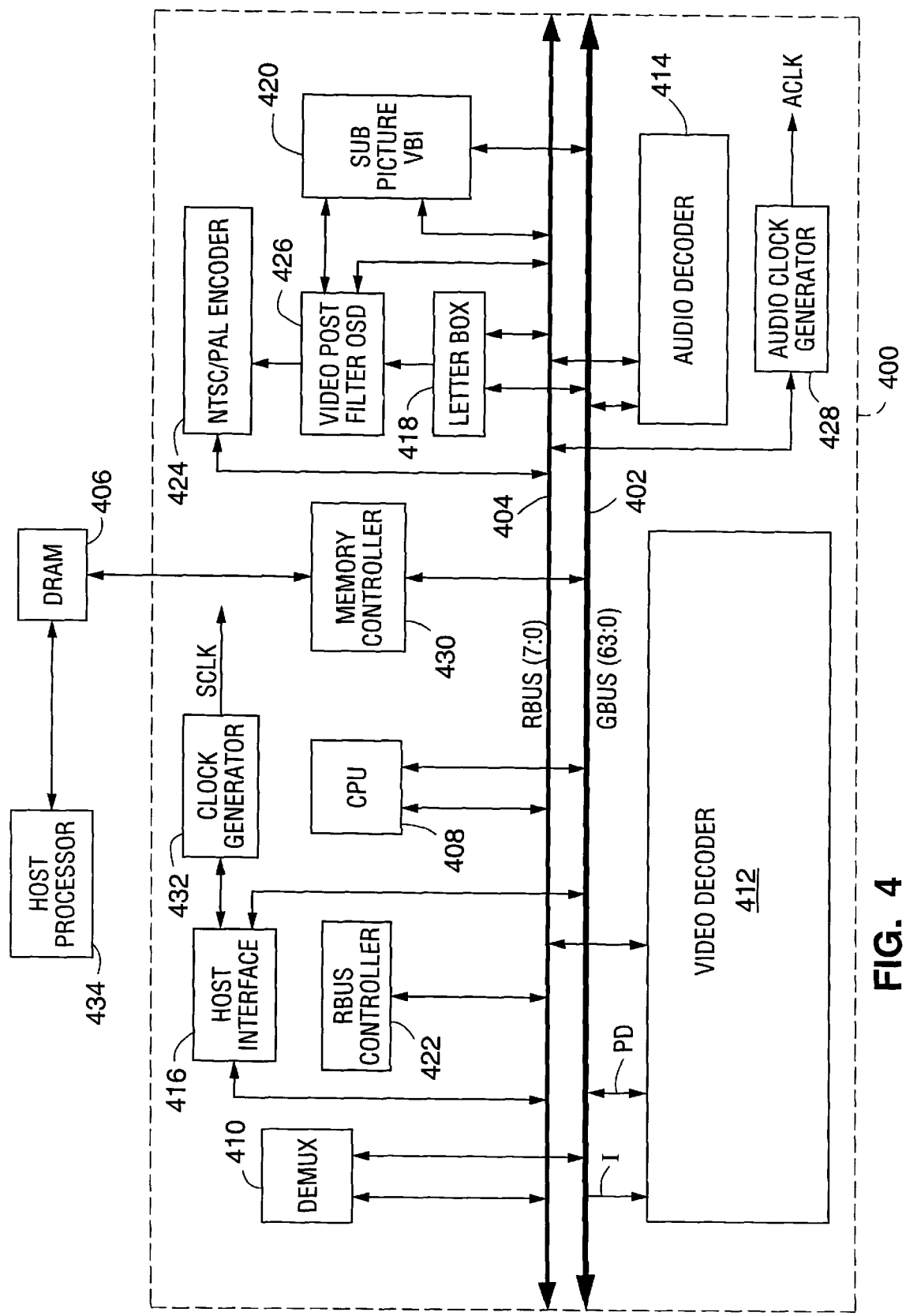
FIG. 4 is a simplified block diagram of a decoding chip.
Figure 5:
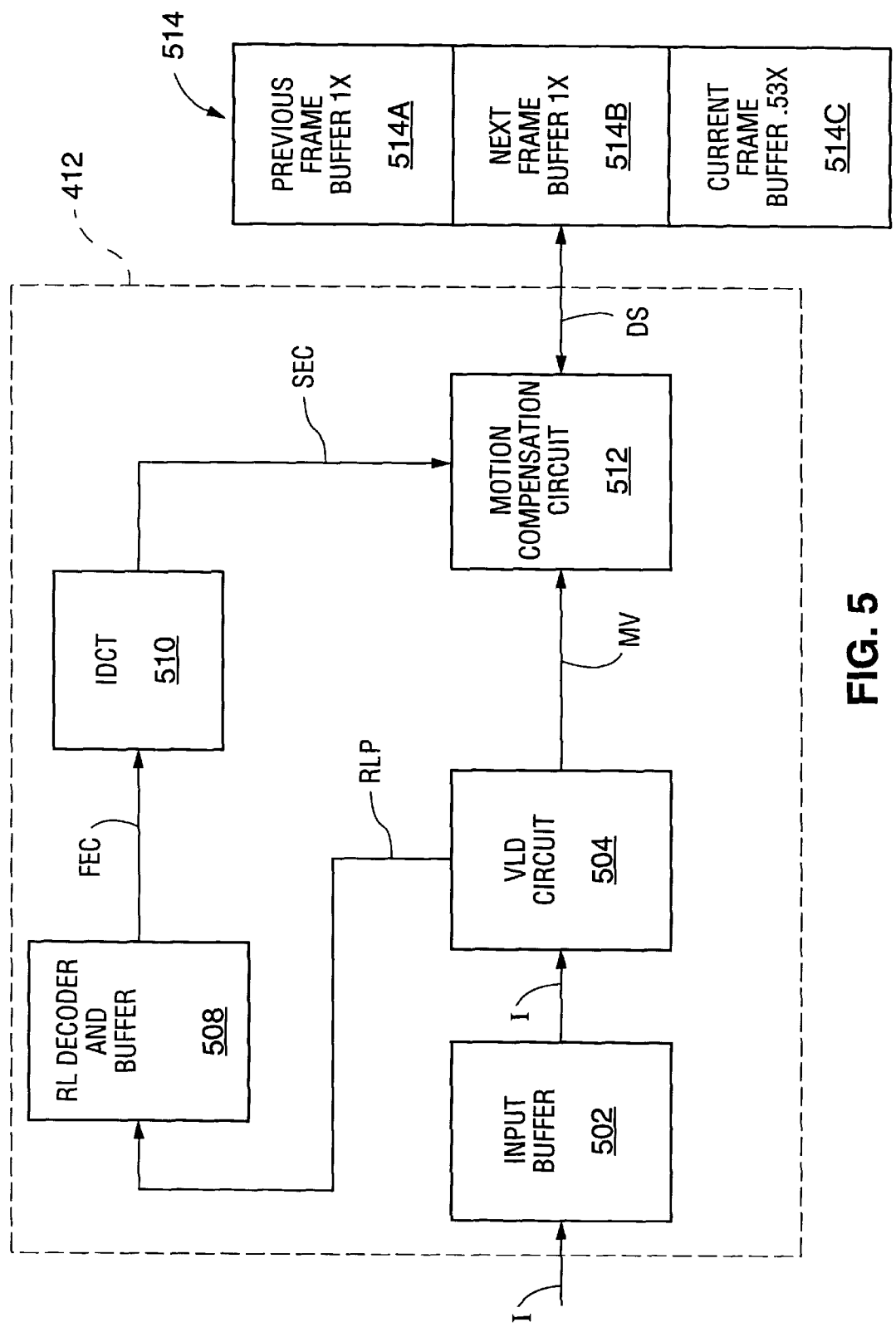
FIG. 5 is a simplified block diagram of a first embodiment of an MPEG video decoder according to the present invention.

FIGS. 4 and 5 show a video decoding chip which requires only a frame memory with a smaller capacity of only 2.53X. FIG. 4 shows the global architecture of the decoding chip with a 2.53X frame memory.

Referring now to FIG. 4, a block diagram of an MPEG2 decoder 400 is shown. Decoder 400 utilizes two internal busses, a GBUS 402 and an RBUS 404. In the preferred embodiment of the invention, GBUS 402 is a 64 bit bus which is utilized for data transfer between DRAM 406 and specific blocks of decoder 400 which are described below. In the preferred embodiment of the invention, DRAM 406 is a synchronous dynamic random access memory, although other types of memories may be utilized. RBUS 404 is an 8 bit bus used primarily for control of specific blocks through reduced instruction set computing ("RISC") CPU 408. RISC CPU 408, which is coupled to both GBUS 402 and RBUS 404, operates to control the functionality of specific blocks, as more particularly described below, as well as performing a portion of video bitstream decoding.

Decoder 400 includes a demultiplexer 410 which is coupled to both GBUS 402 and RBUS 404. Similarly, a video decoder 412, an audio decoder 414, a host interface 416, a letter box unit 418, and a sub picture/vertical blanking interval decoder 420 are each coupled to both GBUS 402 and RBUS 404. An RBUS controller 422, an NTSC/PAL encoder 424, a video post filter/on screen display system 426 and an audio clock generator 428 are each coupled to RBUS 404. Audio clock generator 428 outputs a clock signal ACLK. A memory controller 430 is coupled to GBUS 402.

A clock generator 432, which provides a clock signal SCLK, is coupled to host interface 416. An output of letter box unit 418 is provided to video post filter on screen display system 426. Sub picture/vertical blanking interval decoder 420 is coupled to video post filter on screen display system 426, which system provides its output to NTSC/PAL encoder 424. Sub picture/vertical blanking interval decoder 420 is coupled to video post filter on screen display system 426. A host processor 434 interfaces with host interface 416.

In the preferred embodiment of the invention, when utilized for DVD applications, sub picture/vertical blanking interval decoder 420 and letter box unit 418 are hardwired units. Letter box unit 418 performs a 4-tap vertical filtering and sub-sampling of a video bit stream provided through GBUS 402 and operates to control the video post filter/on screen display system 426. Sub picture/vertical blanking interval decoder 420 operates to decode sub picture ("SP") and vertical blanking interval ("VBI") information in the video bit stream.

Typically, a sub picture bitstream consists of subtitles or menu items. For example, this would include karaoke and menu highlighting. Since the VBI bitstream and the SP bitstream are very similar in syntax and functionality (under MPEG2 specifications), the functionality for decoding both types of bitstreams is incorporated into a single sub picture/vertical blanking interval decoder 420. Thus, in a preferred embodiment of the invention, decoding of the VBI bit stream occurs during the vertical blanking period, while SP bitstream decoding occurs during active display periods.

In a preferred embodiment of the invention, in non-DVD operation, the sub picture/vertical blanking interval decoder 420 decodes and displays on screen display ("OSD") bit-streams. In DVD operation, however, OSD bitstreams are instead decoded by video post filter on screen display system 426.

RISC CPU 408 operates to parse the video bitstream in order to control the decoder 400. RISC CPU 408 also partially decodes the video bitstream (for example, decoding of top-level data such as headers) and also controls various of the other units within decoder 400 through RBUS 404. A portion of the parsing is also performed by sub picture/video blanking interval decoder 420. More particularly, RISC CPU 408 can be utilized to change the position of an SP window through RBUS 404. Thus, a user can move the SP window up or down through a command to CPU 404 with a Y coordinate as a parameter.

Letter box unit 418 is essentially a vertical decimation filter with downloadable coefficients. Letter box unit 418 operates to decimate an active area of a frame which has a ratio of 4:3. Therefore, for PAL sequences, letter box unit 418 converts a 720×576 frame to a 720×432 frame. For NTSC sequences, letter box unit 418 converts a 720×480 frame to a 720×360 frame. However, in both cases, the active picture area is centered with respect to a display area.

Host processor 434 and RISC CPU 408 utilize DRAM 406 to exchange messages, commands and status information. In the preferred embodiment of the invention, processor 434 and CPU 408 have the capability to interrupt each other. In operation, CPU 408 provides a host command parser to execute such commands from host processor 434. A typical sequence of events during execution of a command by host processor 434 is:

1. Host processor 434 writes a command to DRAM 406 and interrupts CPU 408.
2. CPU 408 reads the command and parameters from DRAM 406.
3. CPU 408 acknowledges the command by writing a status variable to DRAM 406.
4. Command parser of CPU 408 parses the command and executes it.
5. Optionally, CPU 408 interrupts host processor 434 upon completion of the command to report status.

Alternatively, CPU 408 polls a DRAM command buffer (not shown) for every field sync. This buffer is a ring buffer where a write pointer is maintained by host processor 434 while a read pointer is maintained by CPU 408.

Video decoder 412 contains an inverse cosine discrete transformer, a variable length decoder 436, a motion compensation unit 438 and an inverse discrete cosine transformer 440. Video decoder 412 decodes a coded video data stream received through GBUS 402 and provides a decoded stream to NTSC/PAL encoder 424 through RBUS 404. NTSC/PAL encoder converts the decoded stream into an analog signal suitable for display on a television monitor having NTSC and/or PAL signal inputs.

Demultiplexer 410 operates on data entering decoder 400. In particular, such data is in the form of packets, and includes audio, video and other streams of multiplexed packets. Demultiplexer 410 selects desired audio packets, video packets and other desired information packets, but rejects the other packets within the video bitstream. For example, audio packets representing audio in several different languages may be present in the video bitstream. Based upon commands from host processor 434, demultiplexer 410 selects only those audio packets corresponding to that language which is selected for presentation with the corresponding video packets.

Host interface 416 provides a glueless interface for host processor 434. RBUS controller 422 sends out messages on RBUS 404 and acts as an arbitrator for RBUS 404. Clock generator 432 provides a clock signal SCLK to the various units within decoder 400, while audio clock generator 428 provides a clock signal ACLK to a digital-to-analog convertor (not shown) which through GBUS 402 receives digital audio signals from audio decoder 414. These digital audio signals are converted to analog signals which can be perceived by humans.

Video decoder 412 decodes a coded, compressed video data stream 1 received through GBUS 402 and provides a decoded stream DS to NTSC/PAL encoder 424 through RBUS 404. NTSC/PAL encoder 424 converts the decoded stream into an analog signal suitable for display on a television monitor having NTSC and/or PAL signal inputs. Video decoder 412 will be explained in more detail below with reference to FIG. 5.

The video decoder circuit 412 includes an input buffer 502, a VLD circuit 504, a run-length decoder and buffer circuit (RL circuit) 508, an inverse discrete cosine transform circuit 510 and a motion compensation circuit 512. The VLD circuit receives compressed input video data 1. The motion compensation circuit 512 can transmit uncompressed displayable pixel data DS to and from a frame buffer memory 514. In the present embodiment, the frame buffer 514 is a designated portion of DRAM 406, and pixel data DS is transmitted to and from the frame buffer 514 via GBUS 402 and memory controller 430. It is noted that the frame buffer may alternatively be placed on the chip 400 and may even take the form of a stand-alone RAM memory with the video decoder circuit 412.

When decoding a B frame, uncompressed pixel data DS for the most immediately I or P previous frame will first be stored in the previous frame buffer portion 514A of the frame memory. Likewise, uncompressed pixel data DS for the most immediately I or P subsequent frame will first be stored in the next frame buffer portion 514B of the frame memory. This data is utilized, as further explained below, by the motion compensation circuit 512 in predictive and interpolative processing necessary to reconstruct a B frame.

After the previous and next frames are stored in the frame buffer 514, the input buffer 502 receives compressed input video data I which is associated with the current B frame. The input data I comes from the DRAM 406 via the memory controller 430 and the GBUS 402. The compressed input video data I includes header information, motion vector information and error coefficient information. More specifically, the error coefficient information is Huffman-coded, run-length coded, frequency-domain error coefficient information. One important function of the video decoder 412 is decoding of this error coefficient information to yield spatial-domain (i.e., display-domain) error coefficients, as will be further explained below.

The input buffer 502 is a small RAM. The input buffer 502 holds only a small amount of compressed video data I, typically about 128 bytes worth of compressed video data I. This small input buffer 502 is helpful to control data flow through the video decoder 412. However, because the compressed video data is stored in the DRAM 406, the input buffer may not be necessary, especially when data transfer from the DRAM 406 to the video decoder 412 is sufficiently fast.

The VLD circuit 502 is essentially a sequencer with has some of the logic necessary to control the timing and flow of video data through the video decoder. The VLD circuit 504 separates the compressed input video data I into its constituent header information, motion vector information MV, and error coefficient information. The header informa-tion is sent to out to various locations on the chip, such as CPU 408. The motion vector information MV is sent to motion compensation circuit 512 to be used to correlate the current macroblock with other macroblocks in the frame buffer 514 during reconstruction of the B frame (as in conventional in MPEG encoding/decoding).

The VLD circuit 504 Huffman decodes the error coefficient information to produce run-level pairs of frequency-domain error coefficients. The Huffman-decoding process is conventional. More specifically, variable length codes (for commonly-occurring run-level pairs) and fixed length codes (for not commonly-occurring run-level pairs) are decoded to obtain the run-level pairs.

However, while conventional VLD circuits, such as VLD 204 explained above, will immediately expand the Huffman-decoded run level pair into its expanded string of frequency-domain error coefficients. In other words, the conventional VLD circuit 204 will immediately (without buffering) expand the Huffman-decoded run-level pair into a string of consecutive zero error coefficients followed by a non-zero coefficient. In the video decoder 412 of FIGS. 4 and 5, on the other hand, the run-level pairs RLP representing frequency-domain error coefficients are sent to RL decoder and buffer circuit 508.

RL circuit 508 is a specially designed buffer circuit which receives and stores the run-level pairs RLP and automatically expands the number in the run-level pair representing the consecutive string of zero coefficients into the expanded string of actual zeroes which the number represents. In this way, the actual frequency-domain error coefficients FEC which can be directly utilized by IDCT circuit 510 are obtained.

Figure 8:
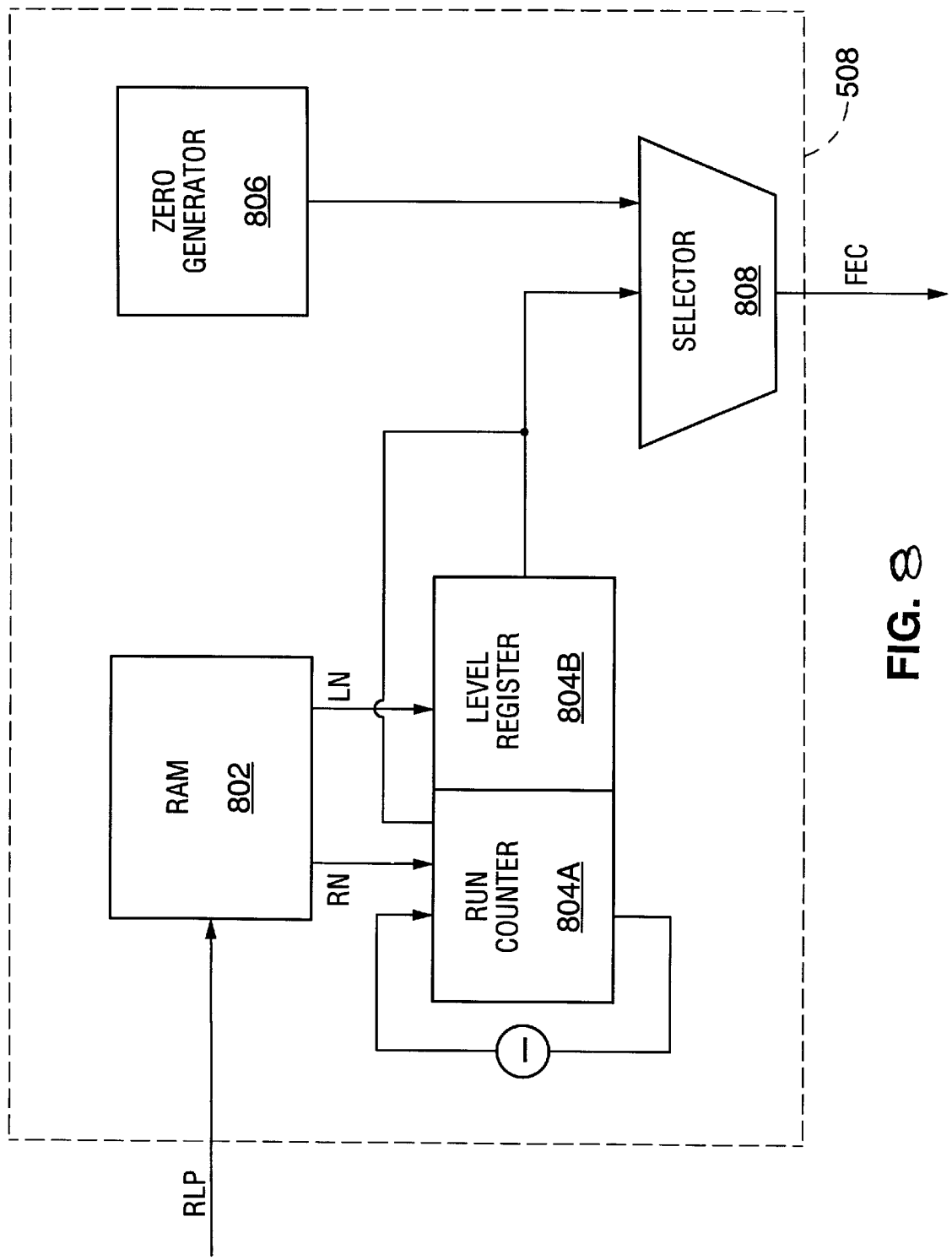
FIG. 8 is a block diagram showing an RL circuit.

The RL circuit 508 is shown in FIG. 8. RL circuit 508 includes RAM 802, register/counter circuit 804, zero generator 806 and selector 808. The register/counter circuit 804 includes a run counter 804A and a level register 804B. The RAM 802 receives and stores run-level pairs RLP from the VLD circuit 504. RAM 802 can store 64 18-bit run-level pairs received from VLD 504.

When IDCT 510 is about ready to receive frequency-domain error coefficients FEC, register/counter 804 receives a run-level pair, as a run number RN and a level number LN, from RAM 802 and run-level decodes it into an actual string of consecutive zeroes followed by a non-zero coefficient. The run number RN (6-bit) is the first number in the run-level pair RLP, and it corresponds to the number of consecutive zero coefficients. The level number LN (12-bit) corresponds to the value of the non-zero coefficient which terminates the run-level pair.

The run number RN is sent from RAM 802 to run counter 804A. Meanwhile, level number LN is sent from RAM 802 to level register 804B, where it is stored.

When the run counter 804A receives the run number RN, the counter will set itself to count down from RN down to 0. For each decrement of the run counter 804A during its countdown, counter 804C will send a signal to selector 808, which indicates that the selector 808 should send a zero frequency error coefficient FEC out to IDCT 510. The selector 808 receives zeroes from zero generator 806, but will only select these zeroes to be sent out as frequency-domain error coefficients FEC each time an appropriate signal is received from the run counter 804A.

Because the run number RN corresponds to the number of consecutive zero coefficients, during its countdown from RN to 0 the run counter 804A will send RN signals to the selector 808 indicating that a zero coefficient should be sent out. In this way, RN consecutive zeroes are sent from the selector 808, and the run level pair data RLP is effectively converted to expanded frequency-domain error coefficients. It is also noted that because the run number RN is converted from a 6-bit run number to an actual string of zeroes subsequent to the period it is buffered in RAM 802, this allows RAM 802 to be made smaller because it only needs to store a 6-bit run number rather than a potentially long string of actual zeroes.

After the run counter 804A has counted all the way down to zero, the selector 808 will receive the level number LN from level register 804B. The selector 808 then sends out to IDCT 510 the level number LN as the non-zero frequency-domain error coefficient FEC terminating the expanded run-level pair.

After a complete run-level pair RLP has been sent retrieved from RAM 802 and run-level decoded by register/counter 804, the next run-level pair RLP will be similarly retrieved and decoded. This run-level pair decoding will continue until a complete block of frequency-domain error coefficients has been sent to IDCT 510 (note that IDCT 510 decodes on a block-by-block basis). When IDCT 510 is ready for the next block of data, the register/counter 804 will again begin decoding run-level pairs stored in RAM 802.

The RAM 802 of RL circuit 508 speeds up the decoding pipeline considerably. Both VLD circuit 504 and IDCT 510 perform time intensive processing on the video data. For example, the VLD 504 can take over 100 chip clock cycles (27 MHz chip clock) to decode headers, especially when the header contains difficult to decode "if-then-else" syntax. The IDCT, on the other hand takes 64 chip clock cycles to convert a block of frequency-domain error coefficients FEC to spatial-domain error coefficients SEC.

If the IDCT 510 has to wait to begin its operation while VLD 504 decoded header data, this adds to the total decode processing time. Also, if the VLD 504 has to wait for the IDCT 510 to finish transforming error coefficients before it can decode further error coefficient information, this again will add to the processing time. However, RL circuit 508 substantially decouples the operation of VLD 504 from the operations of IDCT 510, and thus insures that VLD 504 and IDCT 510 can operate continuously.

When VLD 504 Huffman-decodes error coefficient information into run-level pairs RLP, these run-level pairs RLP can be sent to the RAM 802 of RL circuit 508, even if the downstream IDCT 510 is occupied in transforming error coefficients from a previous block. VLD 504 does not have to wait for IDCT 510 and operates more continuously.

Likewise, IDCT 510 is ready to transform error coefficients FEC, spatial-domain error coefficients can be supplied from the "stockpile" of run-level pairs in to the RAM 802 of RL circuit 508, even if the downstream IDCT 510 is occupied in transforming error coefficients from a previous block. VLD 504 does not have to wait for IDCT 510 and operates more continuously. Because of the decoupling of VLD 504 and IDCT 510 provided by RL circuit 508, a macroblock of compressed data can be decoded in about 450 chip clock cycles (of the 27 MHz chip clock).

As mentioned above, the expanded frequency-domain error coefficients are provided to IDCT circuit 510. IDCT circuit 510 performs an inverse discrete cosine transform on the expanded frequency-domain error coefficients FEC to produce spatial-domain error coefficients SEC.

As mentioned above, the motion compensation circuit 512 utilizes the motion vector information MV, the spatial-domain error coefficients SEC, and uncompressed pixel data DS to generate uncompressed, displayable pixel data for the current B frame.

The processing may be done as conventional MPEG reconstruction. In general terms, the motion vector information correlates the macroblock being currently decoded to macroblocks from a previous frame and from a next frame. Results of predictive processing based on the previous frame and the next frame are interpolated so that the currently decoded B frame is bi-directional in the sense the both previous and next frames are utilized. This predictive processing effectively restores information based on temporal redundancy between frames, which allows B frames to be so effectively compressed. The motion compensation circuit 512 also utilizes the error coefficients to account for any small differences between the macroblock as predicted by motion vectors and the actual macroblock. Also, to the extent that the B frame is intra-coded, decoded, uncompressed pixel data from the current frame is also used in the reconstruction performed by the motion compensation circuit 512.

As mentioned above, decoded, reconstructed pixel data DS for the current frame is sent from the motion compensation circuit 512 to the current frame buffer portion 514C of the frame memory. From the current frame portion 514C, the pixel data DS for the current frame can be displayed by a display (not shown).

The current frame portion 514C of the frame memory 514 has a capacity of 0.53X. Of this 0.53X, 0.5X is used to store pixel data DS for the bottom field of the current frame. In this embodiment, the entire bottom field is stored because compressed data for the top and bottom fields may be intermingled. While the top field can be displayed fairly immediately and therefore requires little buffering, the bottom field must be entirely buffered until the display device has displayed the top field and is ready to display the bottom field.

The remaining 0.03X of the 0.53 current frame portion is used to store pixel data DS for the top field of the current B frame. The 0.03X worth of stored pixel data is stored for video buffering purposes and also may be helpful to the extent that the B frame is intra-coded and access by the motion compensation circuit 512 to uncompressed pixel data DS of the current frame is required.

The B frame video decoding of the embodiment of FIGS. 4 and 5 is relatively fast, at least in part to RL decoder and buffer 508 explained above. This fast decoding helps to allow the capacity requirement of the current frame portion 514C of the frame memory 514 to decrease from the conventional 1X to 0.53X by controlling the current frame buffer 514C to store (substantially) only bottom field displayable pixel data while a frame is being decoded.

An alternative embodiment of a video decoder circuit 600 for decoding a B frame of MPEG encoded will now be explained with reference to FIGS. 6 and 7. Video decoder 600 includes input buffer 502, RL circuit 508, IDCT circuit 610, motion compensation circuit 512 and frame buffer memory 614. Input buffer 502, RL circuit 508, and motion compensation circuit 512 have been explained above in connection with FIGS. 4 and 5.

IDCT circuit 610 is actually made up of two identical, parallel IDCT sub-circuits 610A and 610B. Because the inverse cosine transform can be a relatively time-intensive process, a bottleneck may be present at an IDCT circuit as the inverse transform is being performed. However, because there are two parallel IDCT sub-circuits 610A and 610B, each sub-circuit can process half of the data, thereby effectively doubling the speed of the IDCT processing.

This increased speed is a feature of the present invention, and is especially useful in conjunction with improvements in other parts of the invention (such as the RL circuit 508) which speed up other portions of the processing. For example, the faster decode pipeline processing (utilizing RL buffer 508 and IDCT 610) allows separate decodes for top and bottom field B frame data, which in turn reduces current B frame memory capacity requirements from 0.53X to 0.03X (or less), as explained in detail below.

It is also noted that the buffering provided by RL circuit 508 allows for co-ordination of the parallel IDCT sub-circuits 610A and 610B. The spatial-domain error coefficients SEC output by IDCT circuit 610 are received by the motion compensation circuit, where they can be directly utilized in reconstructive and predictive processing to generate uncompressed pixel data for the current B frame picture.

The frame buffer 614 includes previous frame buffer portion 614A, next frame buffer portion 614B and current frame buffer portion 614C. Portions 614A and 614B are similar to portions 514A and 514B explained above in connection with FIG. 5. On the other hand, current frame buffer portion 614C has a capacity of only 0.3X (rather than the 0.53X capacity of current frame buffer portion 514C). This further reduction in required current frame buffer capacity 614C is achieved because in the embodiment of FIGS. 6 and 7, the bottom field of a B frame is not stored while decoding and reconstructing the top field of the B frame. Because the storage of the bottom frame requires 0.5X of frame memory, a reduction of 0.5X frame memory is realized by not saving the bottom field.

Figure 6:
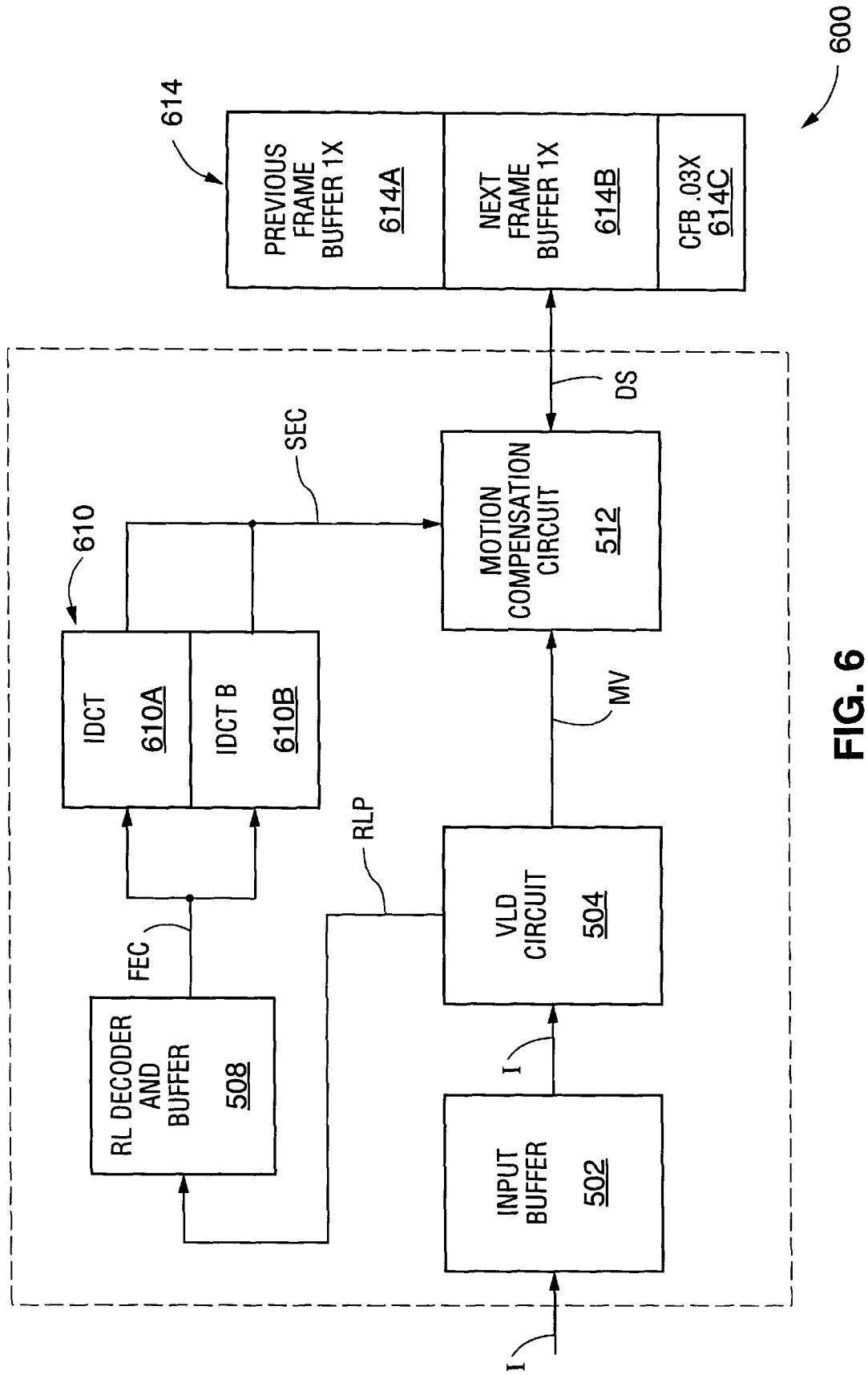
FIG. 6 is a simplified block diagram of a second embodiment of an MPEG video decoder according to the present invention.
Figure 7:
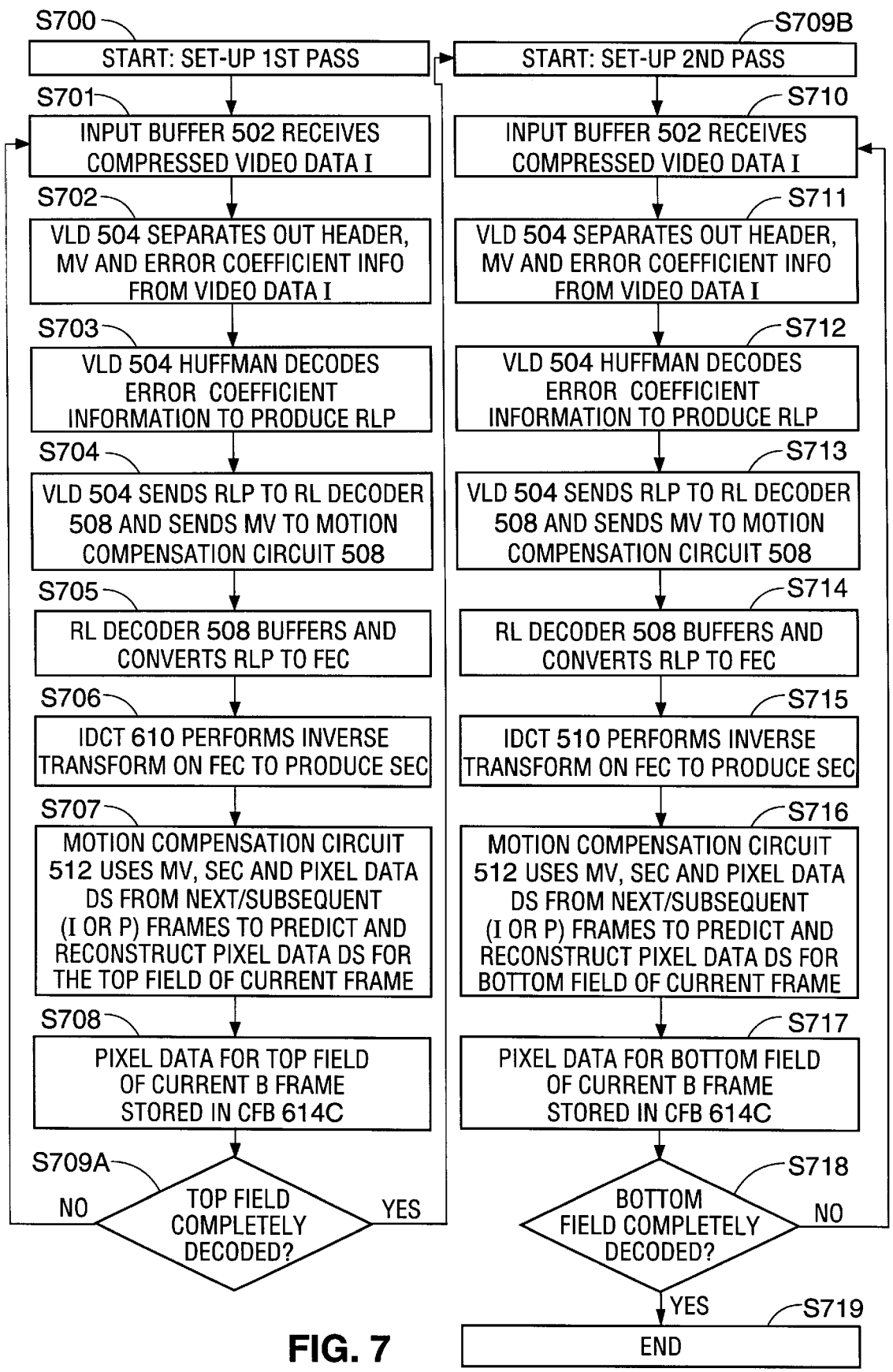
FIG. 7 is a flowchart showing video data decoding operations according to the present invention.

More particularly, the embodiment of FIGS. 6 and 7 will decode the B frame twice, once to obtain displayable pixel data for the top field and once to obtain displayable pixel data for the bottom field. When the B frame is decoded the first time, the top field is reconstructed and portions of only the top field are saved in the current frame buffer portion 614C. There is capacity to store 0.03X worth of top field pixel data for the purpose of providing a small buffer between the decoding pipeline and a display device (not shown) which utilizes the uncompressed top field displayable pixel data to control a display.

When the B frame is decoded the second time, the bottom field is reconstructed and portions of only the bottom field of the current B frame are saved in the current frame buffer portion 614C. Again, there is capacity to store 0.03X worth of bottom field pixel data, which is useful for video buffering purposes. It is noted that the 0.03X current frame portion 614C can be used to store bottom field pixel data during the second decoding pass because the top frame will have been fully displayed by the time the second (i.e., bottom frame) decoding pass is taking place.

In order to explain this two-pass B frame decoding in more detail, FIG. 7 is a flowchart which sets forth the sequence of operations for decoding and reconstructing the current B frame. The sequence of FIG. 7 is controlled by a CPU (such as CPU 408) and the VLD circuit. In general terms, the VLD circuit decodes and reconstructs displayable pixel data for the top field at steps S701 to S709A. Then the VLD circuit decodes and reconstructs displayable pixel data for the bottom field at steps S709B to S717.

Although, the first decoding pass (steps S701 to S708) and the second decoding pass (steps S709B to S717) are each shown as several steps, it is to be understood that the order of the steps merely indicates the order of operations performed on a given portion of compressed video data as it is decoded to yield error coefficients and generate displayable pixel data. En practice, compressed data is fed continuously through the decoding pipeline, which means that steps S701 to S708 will be occurring simultaneously to a substantial extent. Likewise, steps S709B to S717 will be occurring simultaneously to a substantial extent.

At step S700, the decoding of the current B frame begins and the various circuits of the decoder circuit are prepared for the first pass wherein the top field will be decoded. At step S701, a portion of video data I equal to about 128 bytes of compressed video data is loaded into the input buffer 502 (e.g., from a RAM, DRAM, disc, etc.). As the pipeline processing of steps S701 to S708 continues, the buffer 502 will be periodically replenished with compressed video data.

At step S702 the VLD circuit 504 separates the header information, the motion vector information MV and the error coefficient information in the input compressed video data I. In accordance with the MPEG2 standard, the current B frame compressed video data I contains intermingled top and bottom field error coefficient information and motion vector information.

At step S703, the VLD circuit Huffman decodes the Huffman-coded, run-length coded, frequency-domain error coefficient information to produce run-level pairs RLP representing the frequency-domain error coefficients. At step S704, the VLD circuit 504 sends the motion vector information MV to the motion compensation circuit 512 and the Huffman-decoded error coefficient information to RL decoder 508. Although in this example the VLD 504 sends out the motion vector information MV after Huffman decoding the error coefficient information and simultaneously with respect to sending out the error coefficient information, the motion vector information MV can be sent out as soon as it is separated out and/or during the Huffman decoding of step S703.

At step S705, the RL decoder receives the run level pairs RLP. As explained more fully above, the RL decoder has a buffer RAM 802 which can store up to 64 run-level pairs and a register/counter 804 to generate zeroes for corresponding to the input run number. This feature is used to effectively convert the run-level pairs into actual frequency-domain error coefficients FEC (with long strings of consecutive zero coefficients) as it buffers the error coefficient information.

At step S706, IDCT circuit 610 (including parallel sub-circuits IDCTA 610A and IDCTB 610B) performs an inverse discrete cosine transform to transform the frequency-domain error coefficients FEC into spatial-domain error coefficients SEC. As mentioned above, the inverse discrete cosine transform processing is fairly time intensive. Even with the parallel IDCT sub-circuit arrangement of IDCT circuit 610, it is still generally the most time-consuming part of the decoding pipeline. The frequency-domain error coefficients are transformed by IDCT circuit on a block basis, with the RL decoder 508 sending blocks of frequency-domain error coefficients to IDCT sub-circuit 610A and sub-circuit 610B on an alternating basis.

At step S707, the motion compensation circuit 512 uses the motion vector information MV, the spatial-domain error coefficients SEC, and pixel data DS from next/subsequent frames to do predictive processing and reconstruction to generate displayable, uncompressed pixel data for (at least) the top field of the current B frame.

At step S709A, it is determined whether the top field has been completely decoded. If the top field has not been completely decoded into displayable pixel data, the processing of steps S701 to S708 continues until the top field is completely decoded. If the top field decoding is completed, the processing proceeds to step S709B. At step S709B, the various circuits of the decoding circuit are prepared for the second pass wherein the bottom field is decoded.

Steps S710 to S715 substantially correspond to steps S701 to S706 respectively. During steps S710 to S715 decode processing is repeated on the same current B frame compressed video data. This repetitive decoding allows the bottom field video data to be stored in compressed form during decoding of the top field, rather than storing this data in uncompressed form. The result is a substantial decrease in memory required by the system.

At step S716, the bottom field is reconstructed as pixel data by the motion compensation circuit, and at step S717, this bottom field pixel data is stored in the current frame buffer portion 614C. At step S718, it is determined whether the bottom field has been completely decoded. If the bottom field has not been completely decoded into displayable pixel data, the pipeline processing of steps S710 to S717 continues until the bottom field is completely decoded. If the bottom field decoding is completed, the processing proceeds to an END at step S719.

In preferred embodiments of the present invention, complete top field decoding (pipeline processing of steps S701 to S709A) takes less time than the time in which the associated display displays one field. For example, for NTSC applications, the field rate is 60 Hz and each field therefore takes 1/60 second for display. Therefore, in this application, complete top field decoding should take less than 1/60 second. If top field decoding takes longer than 1/60 of a second, then the decoding will not keep up with a real-time display of the video data.

Likewise, in preferred embodiments of the present invention, complete bottom field decoding (repeated cycle of steps S710 to S717) takes less time than the time in which the associated display displays one field. If bottom field decoding takes longer than the field display period, then the decoding again will not keep up with a real-time display of the video data.

The video decoding circuit 600 of FIG. 6 can decode video data with sufficient speed so that a real time NTSC display can be generated from MPEG compressed video data, despite the fact that each frame is decoded twice (once for top field display and once for bottom field display).

More specifically, the decode circuit 600 utilizes a 27 MHz chip clock. Given the 60 Hz field display rate of an NTSC display, this means that the decode circuit must provide displayable pixel data for a field within about 450000 cycles of the chip clock. The decode circuit 600 can decode an entire frame (in order to generate top or bottom field displayable pixel data) in 337500 cycles.

This fast frame decode rate is due in large part to the RL buffer 508 and the parallel IDCT sub-circuits 610A, 610B. For example, a unitary IDCT circuit (such as IDCT 210) decodes on a block-by-block basis, with each block will taking 64 cycles of the chip clock. Because there are 6 blocks per macroblock, IDCT decoding of one macroblock will take 384 clock cycles. On the other hand, by utilizing IDCT 610, which has two parallel IDCT sub-circuits 610A, 610B, macroblock IDCT decoding time is cut in half, down to 192 clock cycles. This allows the entire decoding time for a macroblock to be decreased to 200 to 250 chip clock cycles. This in turn allows decoding time for the entire frame to be brought down to around 337500 chip cycles so that the entire frame can be decoded twice and required frame memory decreased in accordance with the present invention.

Required frame memory capacity may be decreased even further by storing only a portion of the previous and/or next frame (used in B frame decoding) at one time. More particularly, the next and/or next frame is stored as compressed video data (e.g., an intra-coded 1 frame). Various portions of this I frame may be decoded and stored in a small previous/next frame buffer (e.g., 0.03X buffer) only as need by the motion compensation circuit during decoding of a B frame.

While preferred embodiments of the present invention have been described above using illustrative examples, it will be understood by those skilled in the art that the invention is not limited by the illustrative examples and that various changes and modifications may be made without departing from the spirit or scope of the invention as set forth in the following claims.

What is claimed is:

1. A video decoding circuit for decoding compressed video data and outputting displayable pixel data, the video decoding circuit comprising:
   a variable length decoding circuit for receiving the compressed video data and for outputting run-level pairs;
   a run-level decoding circuit comprising:
      a buffer memory for receiving and storing the run-level pairs output by the variable length decoding circuit, and
      a run-level decoding means for converting the run-level pairs stored in the buffer memory to transform-domain error coefficients; and
   an inverse transform circuit for receiving transform-domain error coefficients from the run-level decoding means and for performing an inverse transform to produce display-domain error coefficients.

2. The video decoding circuit according to claim 1, wherein the inverse transform circuit performs an inverse discrete cosine transform to transform frequency-domain error coefficients into spatial-domain error coefficients.

3. A video decoding circuit for decoding compressed video data and outputting displayable pixel data, the video decoding circuit comprising:
   a variable length decoding circuit for receiving the compressed video data and for outputting run-level pairs;
   a run-level decoding circuit comprising:
      a buffer memory for receiving and storing the run-level pairs output by the variable length decoding circuit,
      a run counter for receiving a run number RN of a run-level pair from the buffer memory, for decrementing a counter RN times and for sending out a run counter output signal each time the counter is decremented, and
      a selector for receiving the run counter output signal and for outputting a zero each time the run counter output signal is received.

4. The video decoding circuit according to claim 3, wherein the run-level decoding circuit further comprises a level register for receiving the level number LN of the run-level pair and for temporarily storing the level number LN.

5. The video decoding circuit according to claim 4, wherein the level number LN is sent from the level register to the selector after the run counter has decremented RN times.

6. A video decoding method for decoding compressed video data and outputting displayable pixel data, the video decoding method comprising the following steps:
   receiving the compressed video data;
   decoding the compressed video data to produce run-level pairs;
   storing the run-level pairs in a buffer memory;
   converting the run-level pairs in the buffer memory into bit-strings of transform-domain error coefficients; and performing an inverse transform on the bit-strings of transform-domain error coefficients to produce display-domain error coefficients.

7. The method of claim 6, wherein the step of converting the run-level pairs in the buffer memory into bit-strings of transform-domain error coefficients comprises:

receiving a run number RN of a run-level pair from the buffer memory;

decrementing a counter RN times;

sending out a run counter output signal each time the counter is decremented;

receiving the run counter output signal by a selector; and outputting a zero each time the run counter output signal is received.

8. The method of claim 7, further comprising the steps of:

receiving a level number LN of the run-level pair by a level register; and temporarily storing the level number LN.

9. The method of claim 8 further comprising the step of:

sending the level number LN sent from the level register to the selector after the run counter has incremented RN times.

* * * * *